US006950958B2

(12) United States Patent
Magen

(10) Patent No.: US 6,950,958 B2
(45) Date of Patent: Sep. 27, 2005

(54) METHOD AND APPARATUS FOR DIVIDING A HIGH-FREQUENCY CLOCK SIGNAL AND FURTHER DIVIDING THE DIVIDED HIGH-FREQUENCY CLOCK SIGNAL IN ACCORDANCE WITH A DATA INPUT

(75) Inventor: Micha Magen, Jerusalem (IL)

(73) Assignee: Intel Corporation, Santa Clara, CA (US)

( * ) Notice: Subject to any disclaimer, the term of this patent is extended or adjusted under 35 U.S.C. 154(b) by 724 days.

(21) Appl. No.: 09/976,298

(22) Filed: Oct. 15, 2001

(65) Prior Publication Data

US 2003/0071664 A1 Apr. 17, 2003

(51) Int. Cl.[7] .................................................. G06F 1/04
(52) U.S. Cl. ........................ 713/500; 713/501; 713/502
(58) Field of Search ................................ 713/500, 501, 713/502; 377/47, 48, 52

(56) References Cited

U.S. PATENT DOCUMENTS 4,179,670 A * 12/1979 Kingsbury .................. 331/10
4,315,166 A * 2/1982 Hughes ....................... 377/33
4,408,327 A * 10/1983 Wahl et al. ................. 714/798
5,195,111 A * 3/1993 Adachi et al. ................ 377/52
5,729,179 A * 3/1998 Sumi .......................... 331/12
6,108,793 A * 8/2000 Fujii et al. .................. 713/400
6,393,088 B1 * 5/2002 Emineth et al. .............. 377/20
6,501,816 B1 * 12/2002 Kouznetsov et al. .......... 377/48
6,760,397 B2 * 7/2004 Wu et al. ..................... 377/47

OTHER PUBLICATIONS

Foroudi et al., Low–voltage low–power topology for high––speed applications, 2001, IEEE, pp. 135–138.*

Nelson Victor P et al., Digital Logic Circuit Analysis and Design, 1995, Prentice Hall Inc., pp. 449–477.*

* cited by examiner

*Primary Examiner*—Chun Cao
*Assistant Examiner*—Mark Connolly
(74) *Attorney, Agent, or Firm*—Pearl Cohen Zedek Latzer, LLP

(57) ABSTRACT

A method including frequency dividing a high-frequency clock signal into a divided frequency, and further dividing the divided frequency into another divided frequency in accordance with a data input (DIN).

15 Claims, 1 Drawing Sheet

METHOD AND APPARATUS FOR DIVIDING A HIGH-FREQUENCY CLOCK SIGNAL AND FURTHER DIVIDING THE DIVIDED HIGH-FREQUENCY CLOCK SIGNAL IN ACCORDANCE WITH A DATA INPUT

FIELD OF THE INVENTION

The present invention relates generally to high-speed clock division, and particularly to apparatus and methods for multi-stage division of high-frequency clock signals.

BACKGROUND OF THE INVENTION

In many different applications, handling of high-speed clock signals is necessary, such as but not limited to, data communication, wherein receivers may recover a clock signal from incoming data. For example, the clock signal may subsequently be used to sample the incoming data in order to generate a new data signal, which has been re-timed or synchronized with the recovered clock signal.

If the clock is a high-speed (i.e., high frequency, the terms being used interchangeably throughout) clock, dividing its frequency by a specific number in order to count bits of the data may comprise complicated and large circuitry.

BRIEF DESCRIPTION OF THE DRAWINGS

The present invention will be understood and appreciated more fully from the following detailed description taken in conjunction with the appended drawing, which is a schematic illustration of a method and circuit for high speed clock division in accordance with an embodiment of the invention.

DETAILED DESCRIPTION OF THE PRESENT INVENTION

Figure 1:
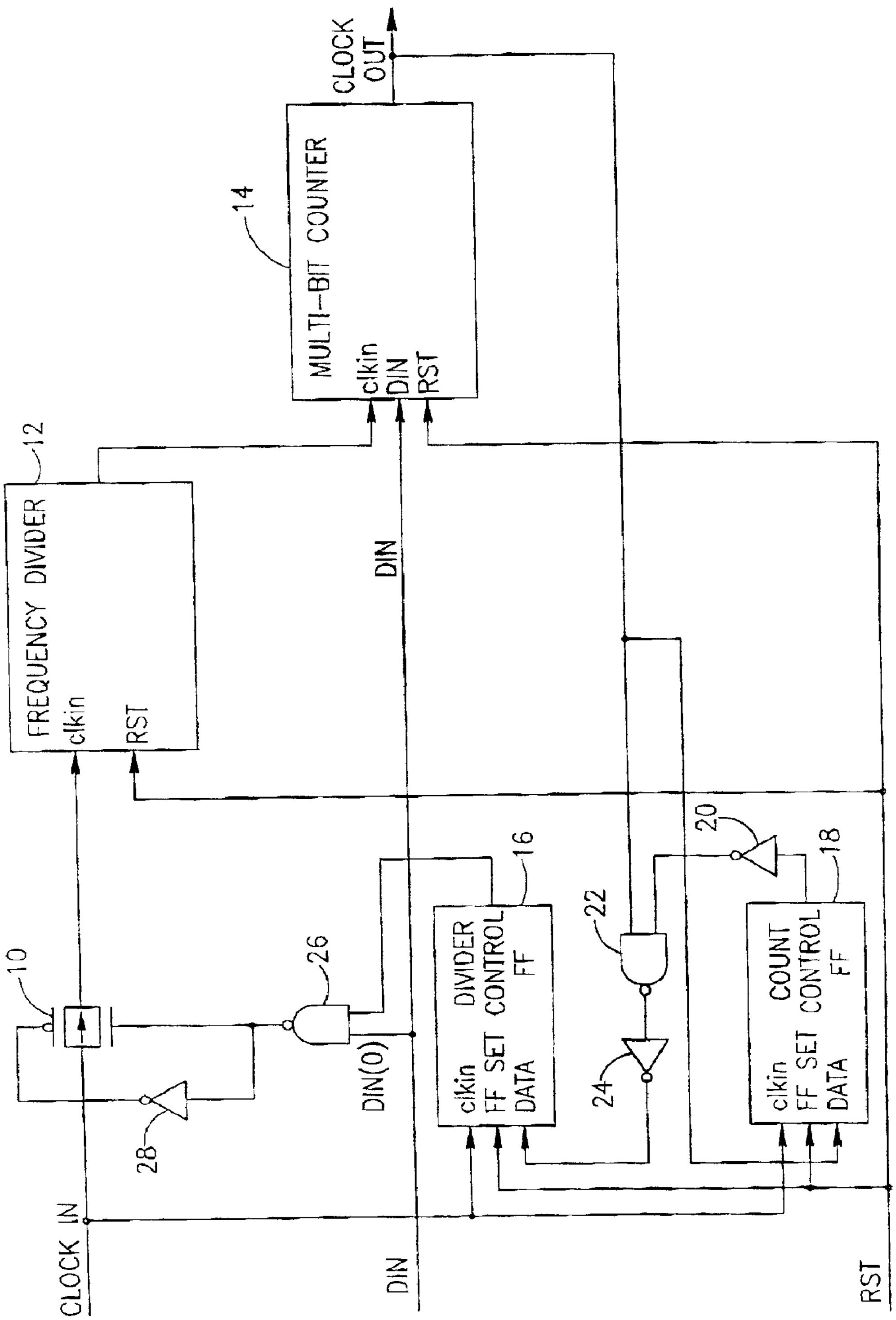

In the following detailed description, numerous specific details are set forth in order to provide a thorough understanding of the invention. However, it will be understood by those skilled in the art that the present invention may be practiced without these specific details. In other instances, well-know methods, procedures, components and circuits have not been described in detail so as not to obscure the present invention.

Some portions of the detailed description that follows are presented in terms of algorithms and symbolic representations of operations on data bits or binary digital signals within a computer memory. These algorithmic descriptions and representations may be the techniques used by those skilled in the data processing arts to convey the substance of their work to others skilled in the art.

An algorithm is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like, It should be understood, however, that all of these and similar terms are to be associated with the appropriate physical quantities and are merely convenient labels applied to these quantities.

Unless specifically stated otherwise, as apparent from the following discussions, it is appreciated that throughout the specification discussions utilizing terms such as “processing,” “computing,” “calculating,” “determining,” or the like, refer to the action and/or processes of a computer or computing system, or similar electronic computing device, that manipulate and/or transform data represented as physical, such as electronic, quantities within the computing system’s registers and/or memories into other data similarly represented as physical quantities within the computing system’s memories, registers or other such information storage, transmission or display devices.

Embodiments of the present invention may include apparatus for performing the operations herein. This apparatus may be specially constructed for the desired purposes, or it may comprise a general purpose computer selectively activated or reconfigured by a computer program stored in the computer. Such a computer program may be stored in a computer readable storage medium, such as, but is not limited to, any type of disk including floppy disks, optical disks, magnetic-optical disks, read-only memories (ROMs), compact disc read-only memories (CD-ROMs), random access memories (RAMs), electrically programmable read-only memories (EPROMs), electrically erasable and programmable read only memories (EEPROMs), magnetic or optical cards, or any other type of media suitable for storing electronic instructions, and capable of being coupled to a computer system bus.

Reference is now made to the single drawing, which illustrates a method and circuit for high speed, dual modulus clock division in accordance with an embodiment of the invention. A high-speed clock signal Clock in may enter a dual-modulus counter, comprising without limitation a pass gate 10 and a frequency divider (or divider-by-two) 12. Frequency divider 12 may comprise, for example, a D-type (i.e., delay type) flip-flop (D-FF) that feeds its Q-bar output into its data input. Such a divider may be easily constructed for high clock speeds.

The output of frequency divider 12 may be fed to a multi-bit counter 14, also referred to as a multi-bit divider 14. In the illustration, multi-bit counter 14 may comprise a 6-bit counter to which data inputs DIN<1:7> may be input, and which outputs a clock out signal (clkout or Clock out). However, it is emphasized that the invention is not limited to these values, and the invention may be carried out with 4-bit, 8-bit and any other amount of bits. In general, multi-bit counter 14 may comprise a 2n-bit counter to which data inputs DIN<1:($2^n$−1)> may be input. Multi-bit counter 14 may further divide the clock frequency, which has already been divided by frequency divider 12, in accordance with the data inputs DIN. In other words, the counter 14 may count clock cycles and Clock Out may be asserted once in a certain number of the clock cycles, said number being specified by the data inputs.

The control of the count (i.e., division) precision of multi-bit counter 14 may comprise controlling bit 0 of the DIN input with control logic circuitry. Multi-bit counter 14 may be controlled by its DIN 1:7 inputs. The dual-modulus counter may be controlled by bit 0, which may make the dual-modulus counter count to 3 instead of 2 on the first “small” cycle of a “large” division cycle. The control logic circuitry may comprise without limitation one or more flip-flops, such as a divider control flip-flop (FF) 16 and a count control FF 18. As seen in the illustrated embodiment, the logic circuitry may comprise without limitation the following connections and inputs: The count control FF 18 may have three inputs: clkin from Clock in, FF set from a reset signal (rst), and data from the clkout output of multi-bit counter 14. The count control FF 18 may output to an inverter 20. A gate 22 may AND the output of inverter 22 and the clkout output of multi-bit counter 14. Gate 22 may output to an inverter 24, whose output in turn may be input as data to the divider control FF 16, The divider control FF 16 may have two other inputs: clkin from Clock in, and FF set from reset signal rst. A gate 26 may AND the output of divider control FF 16 and the DIN<0> bit. The output of gate 26 may be fed to pass gate 10 and an inverter 28 connected to pass gate 10. Frequency divider 12 may receive input from clkin and rst. Multi-bit counter 14 may receive input from clkin, DIN<1:($2^n$−1)> and rst. It is noted that the multi-bit clkin input may be fed by the clkout output of the frequency divider 12.

Division of a high-frequency clock signal (Clock in) may be accomplished in two or more stages. For example, in a first stage, the clock signal may be divided in two by frequency divider 12. Alternatively, the clock signal may be divided by a different number. For example, as described hereinbelow, the pass gate 10 may be controlled by the control logic circuitry to divide the signal by three (3). As mentioned above, the clock signal may be further divided by multi-bit counter 14 in accordance with the number specified by the DIN inputs. The output is the divided clock signal Clock out.

In one embodiment, the divider control FF 16 and the count control FF 18 may sample at the Clock in frequency, which may be a very high frequency. When the multi-bit counter 14 outputs a "1", e.g., once in a count cycle, the control logic circuitry may close the pass gate 10 for one Clock in cycle, if the DIN<0> bit is set, meaning that a count value required is odd. If the required count value of the DIN is even, no action may be taken. After this cycle, the pass gate 10 may open again, and remain open until the next count of the multi-bit counter 14. Thus, the pass-gate 10, when closed, allows a delay of one clock cycle, and may enable the first counting stage to divide the signal in thee instead of two. In his manner, the second stage's count (whose input is the divided clock) may also get delayed by one cycle, thereby performing the division by an odd value, and enabling full programmability over the whole data <0:6> bit range. The delay by one clock cycle may enable using a simple initial stage divider, while maintaining full programmability of the counter.

It is appreciated that larger counters may be used to divide the signal into other divisions, such as but not limited to 5 or 6, for example. A ⅔ divider may be significantly smaller and easier to construct, however, than other dividers, such as a ⅚ divider. In many applications, a frequency division of two may be sufficient to construct a counter with adequate count precision for a high number of bits. The only elements that may have to function at the high speed of Clock in are the divider control FF 16, the count control FF 18 and the rest of the control logic circuitry.

It will be appreciated by persons skilled in the art that the present invention is not limited by what has been particularly shown and described herein above. Rather the scope of the invention is defined by the claims that follow:

What is claimed is:

1. A method comprising:

dividing a high-frequency clock signal into a divided frequency signal in accordance with a data input; and dividing said divided frequency signal into a further divided frequency signal in accordance with said data input, wherein dividing said high-frequency clock signal comprises:

passing said high-frequency clock signal through a pass gate; and sampling said high-frequency clock signal.

2. The method according to claim 1, wherein dividing said high-frequency clock signal further comprises, after said sampling, selectively closing said pass gate in accordance with a count value of said data input.

3. The method according to claim 2, wherein said selectively closing comprises closing said pass gate if said count value is odd.

4. The method according to claim 2, wherein said selectively closing comprises using at least one flip-flop.

5. The method according to claim 1, wherein dividing said high-frequency clock signal comprises dividing said high-frequency clock signal using a D-type flip-flop that feeds its Q-bar output into its data input.

6. An apparatus comprising:

a frequency dividing arrangement adapted to divide a high-frequency clock signal into a divided frequency signal in accordance with a data input, and to divide said divided frequency signal into a further divided frequency signal in accordance with said data input. wherein said frequency dividing arrangement comprises:

a frequency divider adapted to divide said high-frequency clock signal into said divided frequency signal;

a multi-bit counter adapted to divide said divided frequency signal in accordance with said data input; and a control configuration to selectively pass said high-frequency clock signal to said frequency divider based on said data input.

7. The apparatus of claim 6, wherein said frequency divider comprises dual modulus frequency divider.

8. The apparatus of claim 6, wherein said frequency divider comprises a D-type flip-flop that feeds its Q-bar output into its data input.

9. The apparatus of claim 6, wherein said multi-bit counter comprises a 2n-bit counter adapted to receive data inputs DIN<1:($2^n$−1)>.

10. The apparatus of claim 6, wherein said control configuration is adapted to control a count precision of said multi-bit counter.

11. The apparatus of claim 6, wherein said control configuration comprises a pass gate to be selectively closed based on a count value of said data input.

12. The apparatus of claim 11, wherein said control configuration comprises at least one flip flop to selectively close said pass gate.

13. The apparatus of claim 12, wherein said at least one flip flop is able to selectively close said pass gate based on an output of said multi-bit counter.

14. An apparatus comprising:

a frequency dividing arrangement adapted to divide a high-frequency clock signal into a divided frequency signal in accordance with a data input, and to divide said divided frequency signal into a further divided frequency signal in accordance with said data input; and an integrated circuit associated with said frequency dividing arrangement, wherein said frequency dividing arrangement comprises:

a frequency divider adapted to divide said high-frequency clock signal into said divided frequency signal;

a multi-bit counter adapted to divide said divided frequency signal in accordance with said data input; and a control configuration to selectively pass said high-frequency clock signal to said frequency divider based on said data input.

15. The apparatus of claim 14, wherein said control configuration comprises a pass gate to be selectively closed based on a count value of said data input.

* * * * *